(12) United States Patent
Neidich et al.

(10) Patent No.: US 6,217,342 B1
(45) Date of Patent: *Apr. 17, 2001

(54) INTERPOSER ASSEMBLY

(75) Inventors: Douglas A. Neidich, Harrisburg; John D. Walden, Mechanicsburg, both of PA (US)

(73) Assignee: InterCon Systems, Inc., Harrisburg, PA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/287,896

(22) Filed: Apr. 7, 1999

Related U.S. Application Data

(63) Continuation-in-part of application No. 08/960,953, filed on Oct. 30, 1997.

(51) Int. Cl.[7] .................................................. H01R 9/09
(52) U.S. Cl. ............................................................. 439/66
(58) Field of Search ........................................ 439/66, 74

(56) References Cited

U.S. PATENT DOCUMENTS

| | | | |
|---|---|---|---|
| 1,983,511 | 12/1934 | Johnson | 173/330 |
| 2,158,969 | 5/1939 | Oliver | 173/324 |
| 2,599,488 | 6/1952 | Sampson | 173/324 |
| 3,346,863 | 10/1967 | Siebold | 343/702 |
| 3,447,040 | 5/1969 | Denton, Jr. | 317/101 |
| 3,954,317 | 5/1976 | Gilissen et al. | 339/17 |
| 4,114,975 | 9/1978 | Weidler | 339/176 M |
| 4,354,729 | 10/1982 | Grabbe et al. | 339/258 R |
| 4,421,370 | 12/1983 | Treakle et al. | 339/59 M |
| 4,511,197 | 4/1985 | Grabbe et al. | 339/17 CF |
| 4,513,353 | 4/1985 | Bakermans et al. | 361/399 |
| 4,593,961 | 6/1986 | Cosmo | 339/61 M |
| 4,647,124 | 3/1987 | Kandybowski | 339/17 |
| 4,655,519 | 4/1987 | Evans et al. | 339/17 |
| 4,664,458 | 5/1987 | Worth | 339/17 |
| 4,678,252 | 7/1987 | Moore | 439/62 |
| 4,699,593 | 10/1987 | Grabbe et al. | 439/71 |
| 4,806,104 | 2/1989 | Cabourne | 439/66 |
| 4,891,023 | 1/1990 | Lopata | 439/637 |
| 4,906,194 | 3/1990 | Grabbe | 439/71 |
| 4,921,430 | 5/1990 | Matsuoka | 439/72 |
| 4,927,369 | 5/1990 | Grabbe et al. | 439/66 |
| 4,961,709 | 10/1990 | Noschese | 439/66 |
| 4,969,826 | 11/1990 | Grabbe | 439/66 |
| 4,998,886 | * 3/1991 | Werner | 439/66 |
| 5,007,845 | 4/1991 | Grabbe | 439/73 |
| 5,015,191 | 5/1991 | Grabbe et al. | 439/71 |
| 5,017,158 | 5/1991 | Liu et al. | 439/609 |
| 5,030,144 | 7/1991 | Seidler | 439/876 |
| 5,092,783 | 3/1992 | Suarez et al. | 439/71 |
| 5,137,456 | * 8/1992 | Desai et al. | 439/66 |
| 5,139,427 | 8/1992 | Boyd et al. | 439/66 |
| 5,152,694 | 10/1992 | Bargain | 439/66 |
| 5,152,695 | 10/1992 | Grabbe et al. | 439/71 |
| 5,167,512 | 12/1992 | Walkup | 439/66 |
| 5,184,962 | 2/1993 | Noschese | 439/66 |

(List continued on next page.)

FOREIGN PATENT DOCUMENTS

WO 90/11629    10/1990   (WO).

Primary Examiner—Renee Luebke
Assistant Examiner—Briggitte Hammond
(74) Attorney, Agent, or Firm—Thomas Hooker, P.C.

(57) ABSTRACT

An interposer assembly includes an insulating plate with passages extending through the thickness of the plate and metal contacts loosely confined in the passages. The contacts include noses that project outwardly from the plate for engagement with contact pads on overlying and underlying circuit members.

55 Claims, 6 Drawing Sheets

U.S. PATENT DOCUMENTS

| | | | |
|---|---|---|---|
| 5,199,889 | 4/1993 | McDevitt, Jr. | 439/66 |
| 5,230,632 | 7/1993 | Baumberger et al. | 439/66 |
| 5,259,769 | 11/1993 | Cruise et al. | 439/65 |
| 5,308,252 | 5/1994 | Mroczkowski et al. | 439/66 |
| 5,324,205 | 6/1994 | Ahmad et al. | 439/66 |
| 5,338,232 | 8/1994 | Bernier | 439/733 |
| 5,342,205 | 8/1994 | Hashiguchi | 439/66 |
| 5,380,210 | 1/1995 | Grabbe et al. | 439/66 |
| 5,395,252 | 3/1995 | White | 439/66 |
| 5,403,194 | 4/1995 | Yamazaki | 439/66 |
| 5,427,535 | 6/1995 | Sinclair | 439/66 |
| 5,437,556 | 8/1995 | Bargain et al. | 439/66 |
| 5,484,295 | 1/1996 | Mowry et al. | 439/66 |
| 5,556,308 | 9/1996 | Brown et al. | 439/746 |
| 5,573,435 | 11/1996 | Grabbe et al. | 439/862 |
| 5,588,845 | 12/1996 | Naitoh et al. | 439/66 |
| 5,588,846 | 12/1996 | Irlbeck et al. | 439/66 |
| 5,628,639 | 5/1997 | Eichholz, Jr. et al. | 439/79 |
| 5,653,598 * | 8/1997 | Grabbe | 439/66 |
| 5,893,761 | 4/1999 | Longueville | 439/66 |
| 5,913,687 * | 6/1999 | Rathburn | 439/66 |
| 5,938,451 * | 8/1999 | Rathburn | 439/66 |

\* cited by examiner

INTERPOSER ASSEMBLY

This application is a continuation-in-part of our co-pending application Ser. No. 08/960,953, filed Oct. 30, 1997.

FIELD OF THE INVENTION

The invention relates to interposer assemblies used for forming electrical connections between spaced contact pads on circuit members.

DESCRIPTION OF THE PRIOR ART

Interposer assemblies are used for forming electrical connections between densely spaced contact pads on adjacent parallel circuit members. The pads on the members are arranged in identical patterns. Commonly, the circuit members are a circuit board and a ceramic plate carrying integrated circuits. The interposer assembly includes an insulating plate and a plurality of through-contacts carried in the plate and arranged in the same pattern as the pads on the circuit members. The contacts project above the top and bottom sides of the plate. The interposer assembly is sandwiched between the two members which are held together with the contacts forming electric connections between aligned pairs of pads.

Interposer assemblies form electrical connections between contact pads arranged in a very close proximity to each other. The pads may be arranged on a one millimeter center-to-center grid. Each assembly may have as many as 961 contacts. Four assemblies are conventionally mounted on a single frame with a total of 3,844 contacts in the frame. In addition to requiring contacts which can be spaced very close to each other, the contacts must make reliable electrical connections with the pads when the assemblies are sandwiched between the circuit members. Failure of a single contact to make a reliable connection renders the entire frame useless.

A low mechanical closure force is required in order to prevent undue stress on a ceramic circuit member. A high closure force could distort or possibly break the ceramic member. Further, interposer assemblies must occupy a minimum width between the circuit members, requiring that the individual electrical contacts in the assembly have a limited height yet possess the required spring properties for establishing reliable electrical connections between the pads without undue closing force.

Conventional interposer assemblies use contacts which occupy a relatively large amount of space in the supporting plate making it difficult to meet closely spaced grid requirements. These assemblies are relatively expensive to manufacture and assemble.

SUMMARY OF THE INVENTION

The invention is an improved interposer assembly including metal through contacts loosely confined in closely spaced passages extending through an insulating plate. The contacts include arcuate portions which when compressed are elastically bent to form wiped pressure connections with opposed pads and reduce the force necessary to sandwich the interposer assembly between the circuit members. The low closure force reduces the risk of damage to an overlying ceramic substrate and allows a large number of contacts in the assembly. The wiped electrical connections between the contacts and the circuit pads form reliable electrical connections between the adjacent pairs of pads and permit installation of the interposer assemblies in user's facilities. The assemblies need not be installed in clean rooms.

The disclosed interposer assemblies use plates and contacts which are easily and inexpensively manufactured and assembled. The plate is a one-piece design and includes through passages with contact retention projections extending into the passages. The arcuate contacts are readily inserted into the passages to snap or latch over the projections, which then hold the contacts loosely in place in the passages prior to sandwiching of the assemblies between circuit members. The contacts are compact, permitting use of the assembly to form electrical connections between very closely spaced contact pads.

In a first embodiment each contact retention projection includes a sloped cam surface facing one side of the plate. The through contacts are inserted into the plate from the side adjacent the cam surfaces. During insertion, cam followers on the lead ends of the contacts engage the cam surfaces and are guided over the retention projections. When fully inserted, the contacts are held in the passages by the retention projections which extend between the free ends of the contacts. The contacts are loosely held in the passages with opposed contact noses spaced apart a distance greater than the thickness of the plate. When compressed, the contacts establish reliable wiped contacts with opposed pads.

In a second embodiment sloped cam surfaces are provided on both sides of the projection. The arcuate through contacts may be inserted from either side of the plate. During insertion, cam followers on the lead ends of the contacts engage cam surfaces and are guided past the projections which then hold the contacts in place. The contact noses are spaced apart a distance greater than the thickness of the plate to form wiped pressure contacts with opposing pads.

When a contact is positioned in a through passage in the second embodiment, rounded surfaces at the free ends of the contact are located adjacent the cam surfaces on opposite sides of the projection. The cam surfaces hold the contact loosely within the passage for floating engagement with opposed contact pads and formation of reliable wiped pressure connections with the pads. The free ends of the contacts are held within the thickness of the plate to limit contact float. The sloped cam surfaces extend to the adjacent walls of the contact passages and assure that during insertion of the contacts into the passages the lead ends of the contacts are guided smoothly over the projections and do not hang up in the corners or junctions between the projections and the adjacent walls. On rare occasions, contacts inserted into the passages in the first embodiment interposer assembly catch in the corners and have been permanently shortened, destroying their ability to form connections between pads.

Other objects and features of the invention will become apparent as the description proceeds, especially when taken in conjunction with the accompanying drawings illustrating the invention, of which there are six sheets of drawings and two embodiments are disclosed.

DESCRIPTION OF THE PREFERRED EMBODIMENTS

Figure 1:
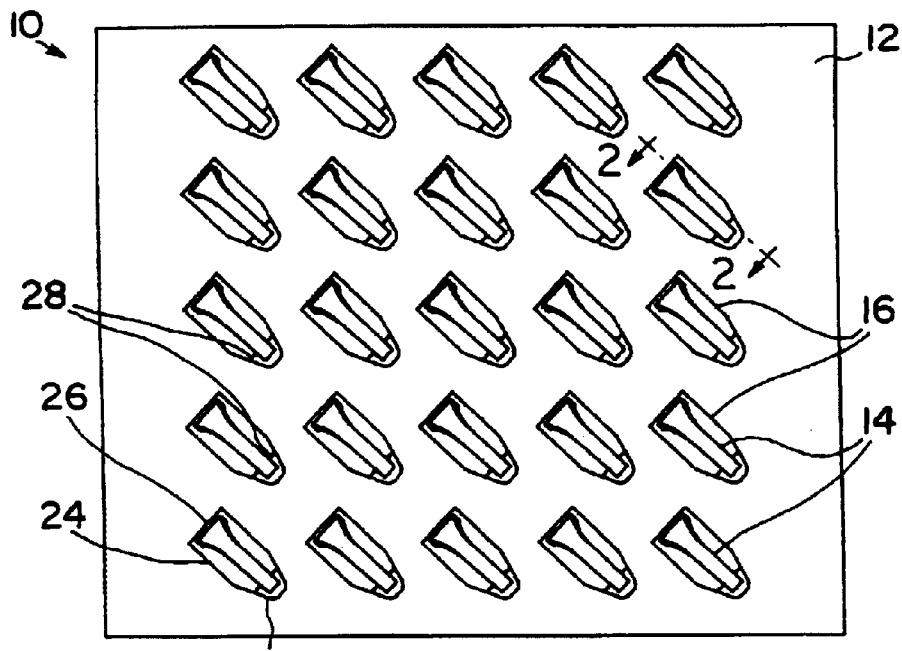
FIG. 1 is a top view of a first embodiment interposer assembly per the invention.
Figure 2:
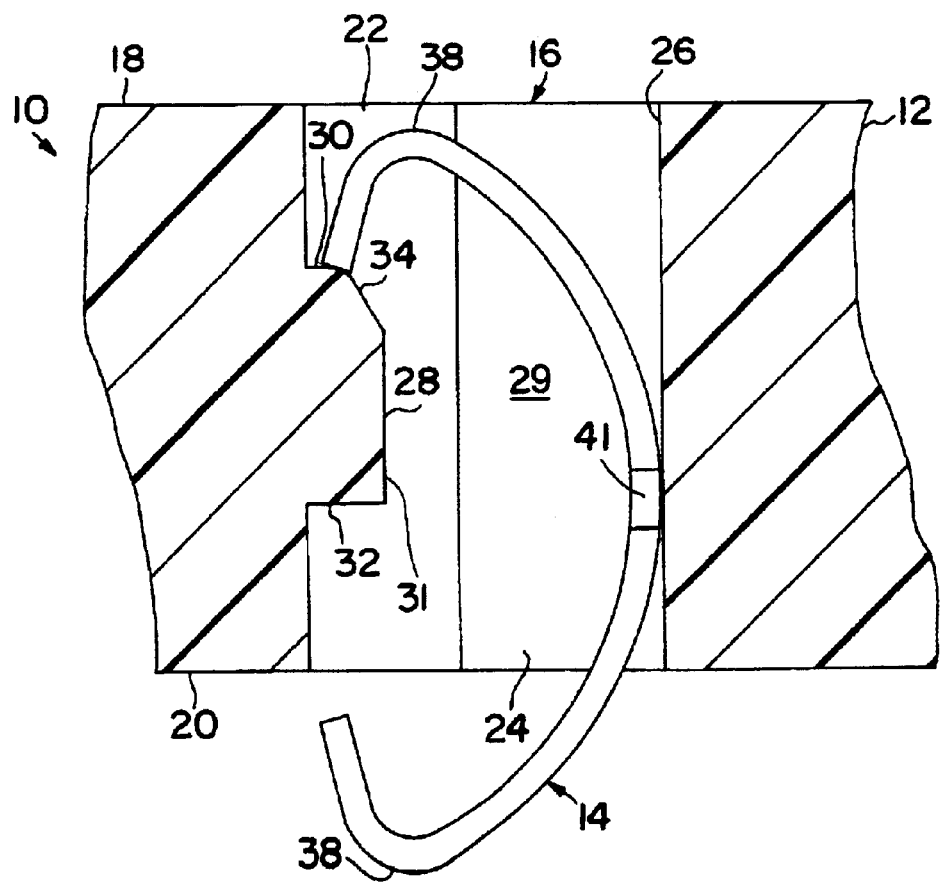
FIG. 2 is a sectional view taken along line 2—2 of FIG. 1.

First embodiment interposer assembly 10 includes a flat plate 12 formed of insulating material with a plurality of metal through contacts 14 positioned in contact passages 16 extending through the thickness of the plate between opposed plate top and bottom sides 18 and 20. As shown in FIGS. 1 and 2, passages 16 are each provided with a reduced width portion 22 and a uniform width portion 24 away from portion 22. Flat end wall 26 extends across the uniform width portion 24 and is located opposite reduced width end wall 23. Wall 23 extends across the reduced width portion.

Contact retention projections 28 are provided in the reduced width portions 22 of passages 16. Projections 28 extend from walls 23 a distance into the passages and narrow the passages at portions 29 between the projections and end walls 26. Narrow portion 29 extends from projection free end 31 to wall 26. The projections include contact retention surfaces 30 and 32 facing plate sides 18 and 20, respectively. The surfaces 30 and 32 are spaced in from the top and bottom sides of the plate. A sloped cam surface 34 extends from each retention surface 30 to the free end 31 of the projection 28 and faces top side 18. Surface 34 facilitates insertion of a contact 14 into passage 16.

Figure 5:
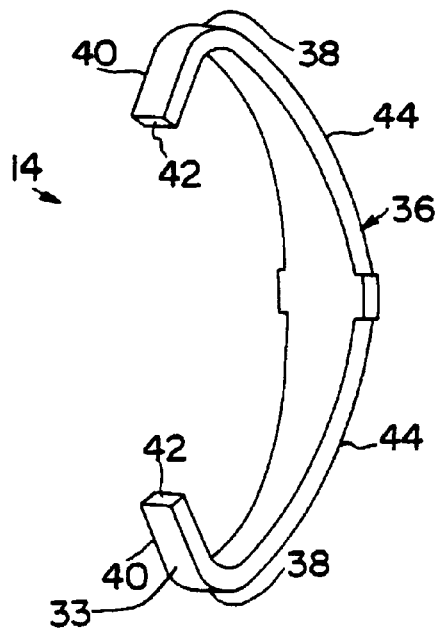
FIG. 5 is a perspective view of the contact shown in the assembly of FIG. 1.

Each metal contact 14 is preferably formed from uniform thickness strip stock, which may be suitably plated beryllium copper. The contact is generally D-shaped and includes a arcuate, convex spring 36 with a pair of opposed contact noses or pad contacts 38 at the ends of the spring. The center of spring 36 extends through narrow passage portion 29. The noses are spaced apart a distance greater than the thickness of the plate 12. Short retention legs 40 extend inwardly from the noses to free ends 42. The legs 40 extend away from spring 36 so that the noses 38 are located between the free ends 42 and the spring. As illustrated in FIG. 5, spring 36 has a maximum width at the center, midway between noses 38 and includes two tapered width spring arms 44 each extending from the center of the spring to a nose 38, in order to reduce stress concentration when the spring is stressed.

Figure 6:
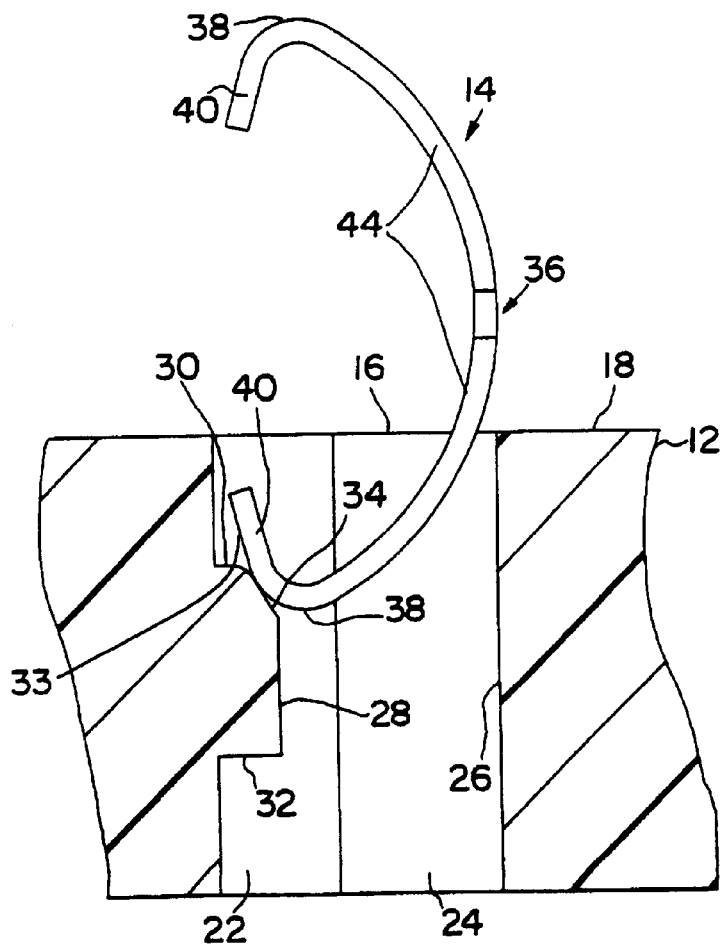
FIG. 6 is a sectional view illustrating insertion of the contact member of FIG. 5 into a passage extending through the plate.

Contacts 14 are inserted into passages 16 as shown in FIG. 6. One nose of the contact is extended into the end of the passage opening at plate top side 18 and is positioned in narrowed portion 29 between the projection 28 and wall 26. As contact 14 is inserted into the passage surface 33 on leg 40 serves as a cam follower and is guided by cam surface 34 to the end of the projection. Spring 36 engages wall 26. The contact is then inserted further into the passage with the result that the lower spring arm 44 is elastically stressed, leg 40 is moved past projection 28 and through narrowed portion 29 and snaps back under retention surface 32 of projection 28. With the contact inserted in passage 16 end 42 of the upper retention leg 40 is above the upper retention surface 30, end 42 of the lower retention leg 40 is located below the lower retention surface 32 and the center 41 of the arcuate spring is adjacent the flat wall 26. Spring 36 is bowed toward wall 26. The contact is loosely held in the passage between wall 23 and end wall 26 and with the projection between the ends 42 of the contact spring 36 at passage portion 29. The distance between the free ends 42 of legs 40 is greater than the height of projection 28, permitting limited free or float movement of the contact in passage 16. FIG. 2 illustrates the position of the contact in the passage when plate 12 is horizontal and the loose contact 14 is supported in the cavity against gravity with the end of the upper leg 40 resting on upper retention surface 30 of projection 28.

As illustrated in FIG. 1, the passages 16 are arranged close to each other in a dense array on plate 12 in order to permit forming electrical connections between similar arrays of contact pads on circuit elements located above and below the assembly. Conventionally, assembly 10 is used for forming electrical connections between contact pads on a ceramic integrated circuit and contact pads of a circuit board. The assembly may be used for forming electrical connections between contact pads on two circuit boards or between contact pads on other types of circuit members.

Figure 3:
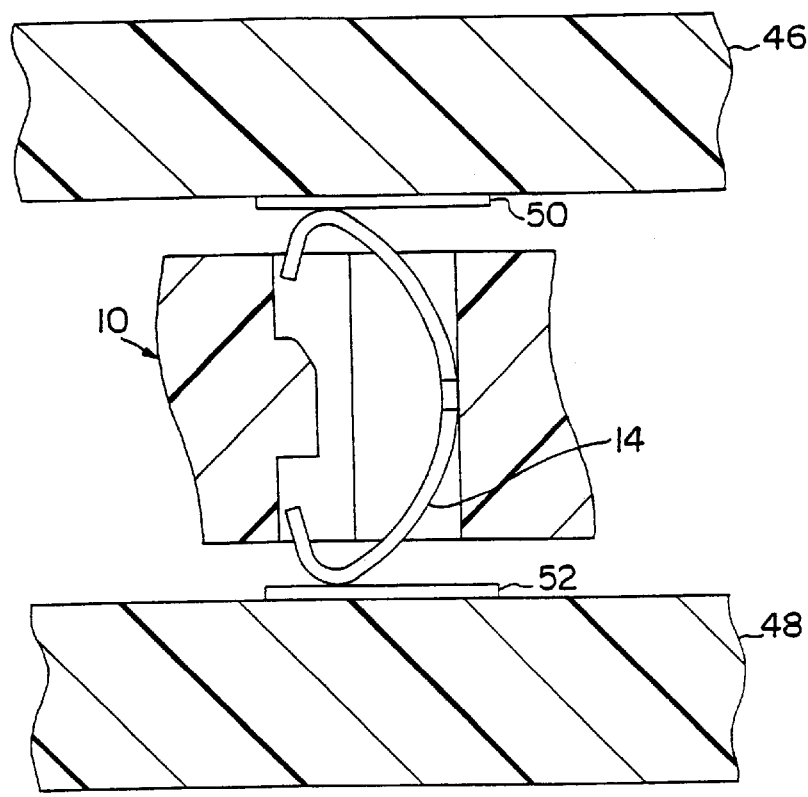
FIG. 3 is a sectional view illustrating the position of the assembly of FIG. 1 between two circuit members.

FIG. 3 illustrates the interposer assembly 10 positioned between upper and lower circuit members 46 and 48 with contact pads 50 and 52 on the members located above and below each contact in the assembly. The contacts lightly engage the pads and are not stressed.

Figure 4:
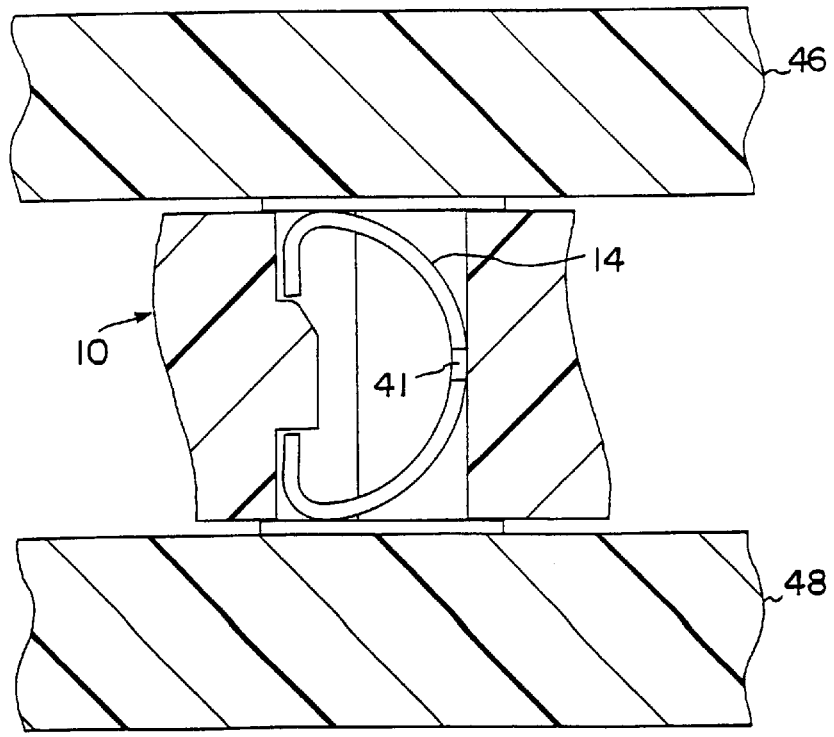
FIG. 4 is a view like FIG. 3 showing the assembly sandwiched between the circuit members.

FIG. 4 illustrates the assembly 10 when fully sandwiched between members 46 and 48 with the members held tightly against the plate 12. When the members are brought into contact with the assembly 10 the two contact pads 50 and 52 are moved together to reduce the height of contacts 14 and elastically bend the two tapered spring arms 44 of arcuate spring 36. The center of the spring engages the end wall 26 as shown in FIG. 4. Bending of the arcuate spring and foreshortening of the contact moves or wipes the contact noses 38 a distance along the contact pads toward wall 23 to make clean, low resistance pressure electrical connections between the contact noses 38 and the pads 50 and 52. The connections assure that the contact 14 provides a reliable, low resistance electrical path between the pads.

As illustrated in FIG. 4, foreshortening of contact 14 moves the free ends 42 of retention legs 40 together and brings the ends in close proximity to the retention surfaces 30 and 32 of projection 28. The retention legs do not engage the projection. Contact pressure is maintained by elastic bending of the spring 36 without bottoming of the ends of the contact on the projection or the walls of passage 16 which could undesirably increase the closing force.

Figure 7:
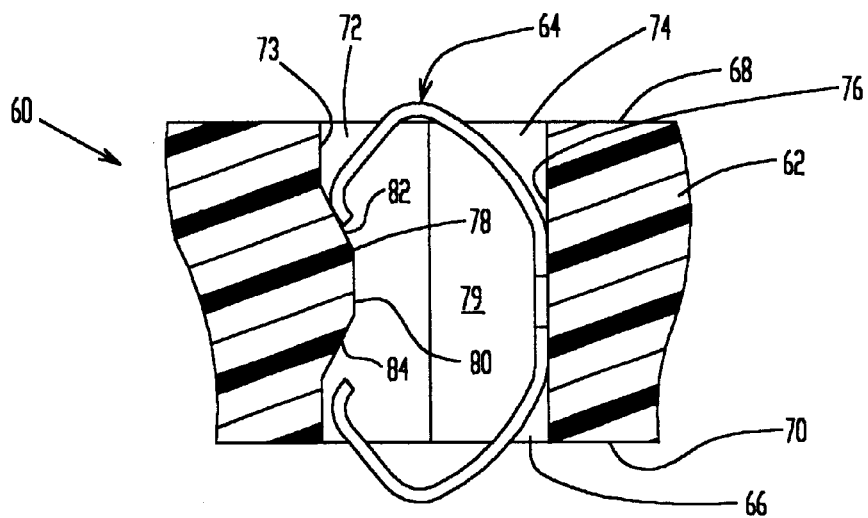
FIG. 7 is a sectional view of the second embodiment like FIG. 2.

FIGS. 7–12 illustrate a second embodiment interposer assembly 60. Interposer assembly 60 includes a flat plate 62 formed of insulating material with a plurality of metal through contacts 64 positioned in contact passages 66 extending through the thickness of the plate between opposed plate top and bottom sides 68 and 70. As shown in FIG. 7, passages 66 are each provided with a reduced width portion 72, like passage portion 22 in the plate 12 passages, and a uniform width portion 74 away from portion 72. Flat end wall 76 extends across the uniform width portion 74 and is located opposite reduced width end wall 73. Wall 73 extends across the reduced width portion.

Contact retention projections 78 are provided in the reduced width portions 72 of passages 66. Projections 78 extend a distance into the passages and narrow the passages at portions 79 between the projections and walls 76. Each projection 78 extends from portion 72 to an inner free end 80 spaced from wall 76 and facing the narrowed passage portion 79. The projections 78 are centered in the passages 66 between the top and bottom sides of the plate.

Figure 8:
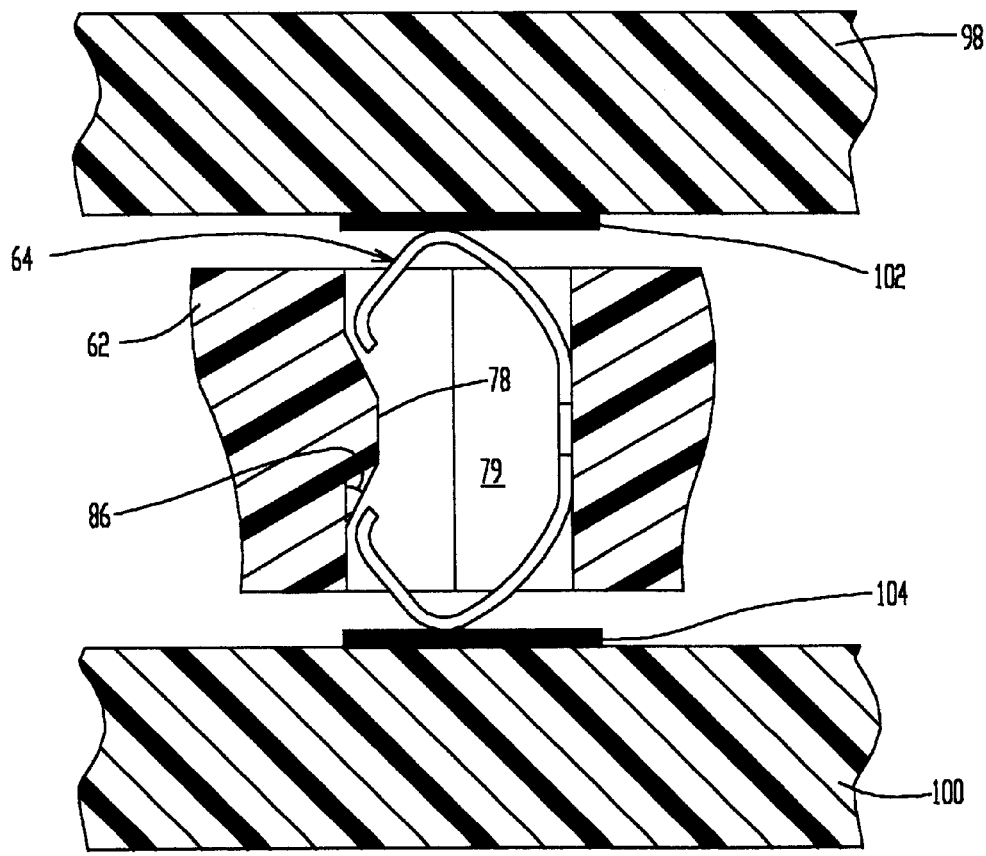
FIG. 8 is a sectional view illustrating the position of the assembly of FIG. 7 between two circuit members.

The projections 78 include sloped upper and lower cam surfaces 82 and 84 facing plate top and bottom 68 and 70, respectively. The cam surfaces 82 and 84 are spaced in from the top and bottom sides of the plate. Each upper cam surface 82 faces top side 68 and extends from wall 73 towards bottom side 70 to the inner end 80. Each lower cam surface 84 faces bottom side 70 and extends from wall 73 towards top side 68 to the inner end 80. As shown in FIG. 8, the upper and lower cam surfaces 82 and 84 are smooth, generally planar and slope at an angle 86 with respect to the axis of passage 66. Angle 86 is preferably about 25 degrees. Cam surfaces 82 and 84 facilitate insertion of contact 64 into passage 66 from either the top or bottom side of plate 62.

The contact 64 is arcuate and includes a flat central spine 88 and upper and lower tapered spring arms 90 extending from the ends of spine 88. Curved contact noses or pad contacts 92 are provided on the outer ends of arms 90. Retention legs 94 extend inwardly from the noses to rounded free ends 96. The contact noses 92 are spaced apart a distance greater than the thickness of the plate 62. The legs 94 extend away from spine 88 so that the noses 92 are located between the ends 96 and the spine.

Each metal contact 64 is preferably formed from the same stock as metal contacts 14. The through contacts 14 used in first embodiment assembly 10 and through contacts 64 used in the second embodiment assembly 60 are each bent from identical flat preforms punched from thin strip metal stock, as previously described.

Figure 12:
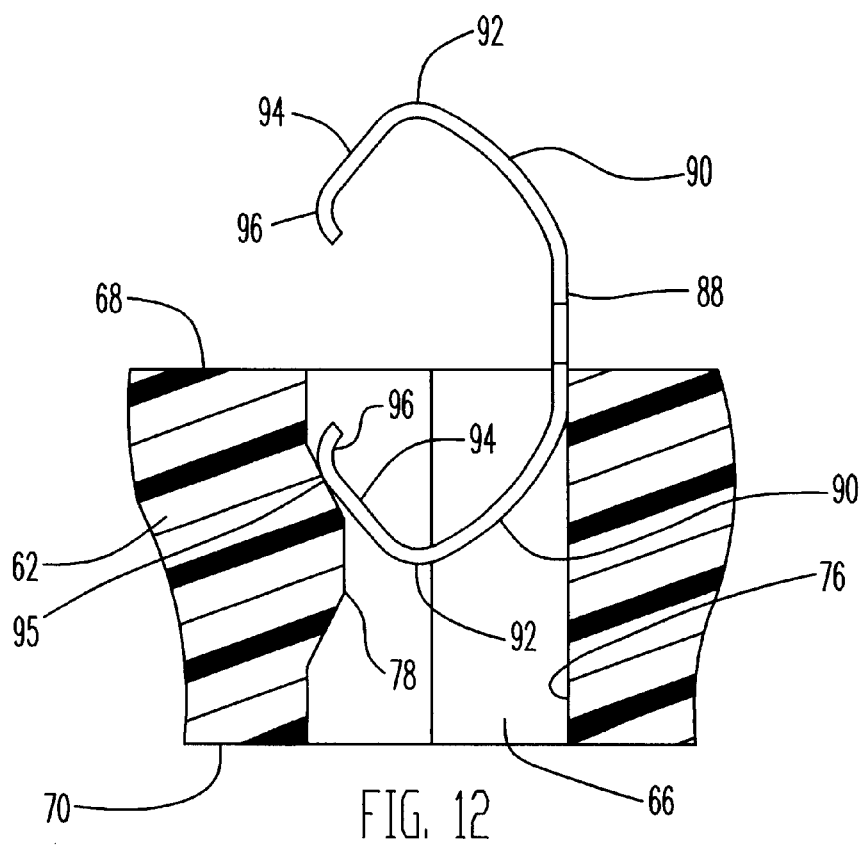
FIG. 12 is a sectional view illustrating insertion of the contact member of FIG. 11 into a passage extending through the plate.

Contacts 64 are inserted into passages 66 as shown in FIG. 12. One nose 92 of the contact is extended into the end of the passage opening at plate top side 68 and is positioned between the projection 78 and wall 76. As the contact is inserted into the passage surface 95 on the lower leg 94 serves as a cam follower and is guided by upper cam surface 82 to the end of the projection. Spine 88 slides along wall 76. The upper cam surface 82 extends smoothly from wall 73 so that contact 64 does not bind or catch between projection 78 and wall 73 when leg 94 engages the projection 78.

The contact is then moved further into the passage and the lower spring arm is elastically stressed as lower leg 94 moves past projection 78 and then snaps back under lower cam surface 84. With the contact inserted in passage 66 the spring arms 90 are bowed out from wall 76 with the upper end 96 located above upper cam surface 82 and the lower end 96 located below the lower cam surface 84. The spine 88 of the contact center portion is adjacent the flat wall 76. In this position, the contact 64 is loosely confined within passage 66 with both free ends 96 located within the thickness of the plate 62. Confinement of the free ends within the thickness of the plate assures that, on collapse, the height of the contact is reduced as described without capture of a free end on one side of the plate. Such capture would prevent the contact from forming a reliable electrical connection between opposed pads. The convex side of each free end 96 faces the adjacent cam surface 82 or 84.

If desired, contacts 64 could be inserted into the plate from the bottom side 70 in the same manner as previously described.

Contacts 64 are loosely held in passage 66. Projections 78 extend between contact ends 96. The distance between ends 96 is greater than the height of projections 78 between the ends 96, permitting limited free movement or float of the contacts in passages 66. FIG. 7 illustrates the position of the contact in the passage when plate 62 is horizontal and the loose contact 64 is supported in passage 66 against gravity. The upper curved end 96 of the upper leg 94 rests on the upper cam surface 82 of projection 78 and the lower curved end 96 of the lower leg 94 remains in the passage. Spine 88 engages wall side 76 and maintains the contact in substantially vertical alignment in the passage.

Spine 88 also resists rocking or rotation of the contact in a clockwise or counterclockwise direction as viewed in FIG. 7. Rocking of the contact is also limited by the proximity of the contact ends 96 to side 72 and cam surfaces 82 and 84. The loose confinement of the contact in the passage assures that the contact is in position to be collapsed to form a reliable connection between opposed pads.

Passages 66 are arranged close to each other in a dense array in plate 62 in the same manner as passages 16 are arranged in plate 12.

FIG. 8 illustrates the interposer assembly 60 positioned between upper and lower circuit members 98 and 100 with contact pads 102 and 104 on the members located above and below contacts in the assembly. The contacts lightly engage the pads and are not stressed.

Figure 9:
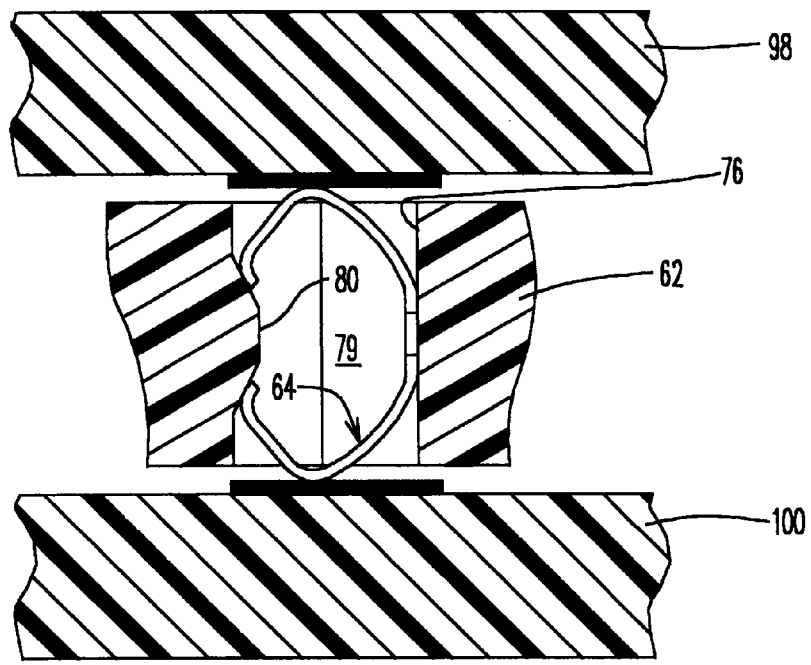
FIG. 9 is a view like FIG. 8 showing the assembly partially sandwiched between the circuit members.
Figure 10:
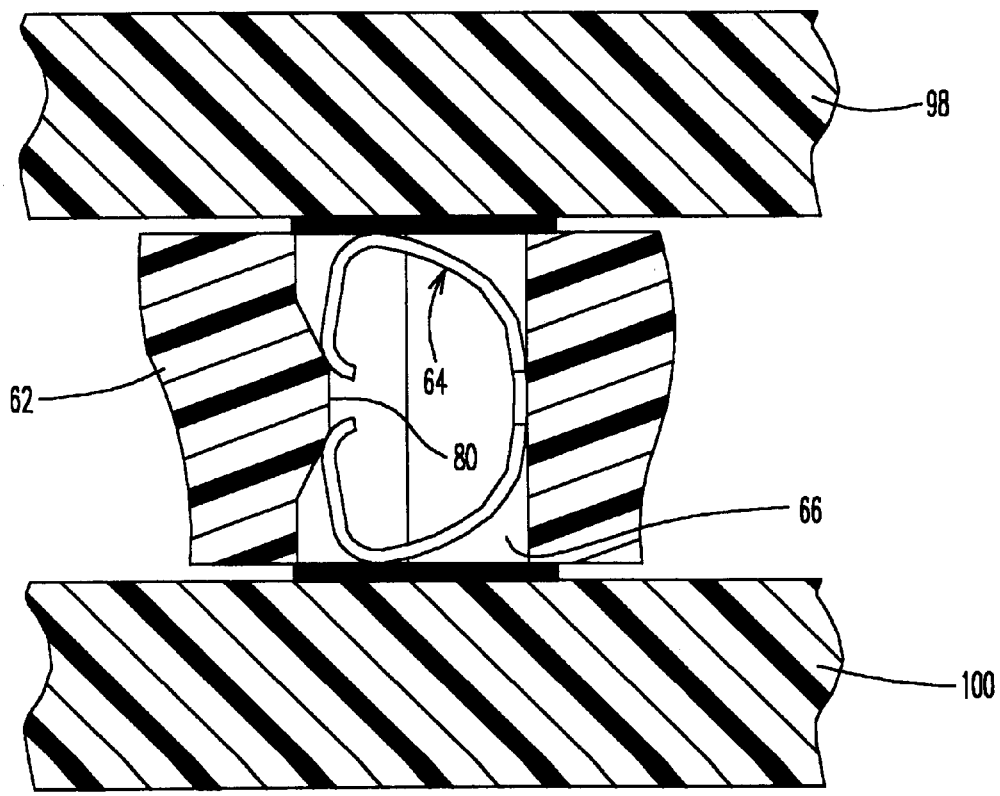
FIG. 10 is a view like FIG. 8 showing the assembly sandwiched between the circuit members.
Figure 11:
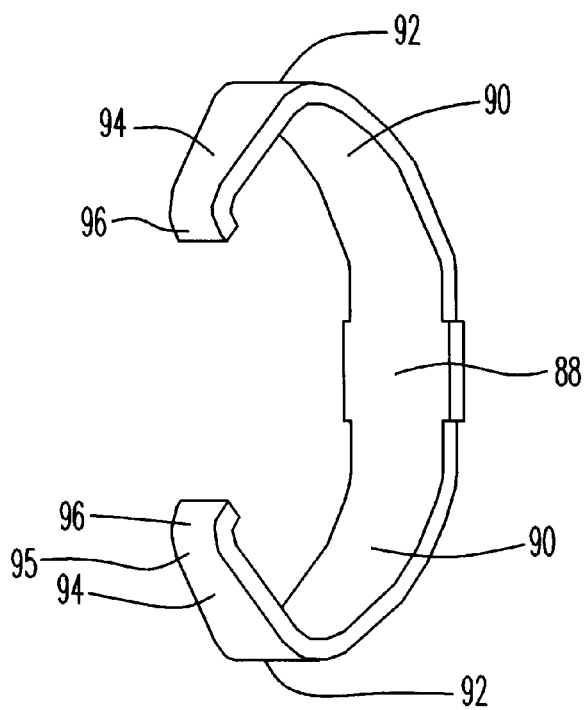
FIG. 11 is a perspective view of the contact shown in the assembly of FIG. 7.

FIG. 9 illustrates the assembly 60 when partially sandwiched between members 98 and 100. When the members are brought toward assembly 60 the two contact pads 102 and 104 are moved together to reduce the height of contacts 64 and elastically bend the two tapered spring arms 90. The curved ends 96 of retention legs 94 move towards each other and towards wall 76. The upper and lower curved ends 96 contact upper and lower cam surfaces 82 and 84 respectively as shown in FIG. 10. After contact, each curved end 96 slides along the cam surface towards projection inner end 80. The curved ends 96 roll slightly on the cam surfaces and maintain tangential engagement with the cam surfaces as the legs slide inwardly toward the free end of the projection. Spine 88 remains flush on wall 76. Contact noses 92 are wiped along the contact pads toward wall 73.

FIG. 10 illustrates the assembly 60 when fully sandwiched between members 98 and 100 with the members held tightly against the assembly plate 62. When the members are brought into contact with the assembly 60 contact pads 102 and 104 reduce the height of contacts 64 to a minimum and further elastically bend spring arms 90. The upper and lower curved ends 96 remain engaged with the cam surfaces near projection inner end 80. The contact spine 88 remains on wall 76. Contact noses 92 have moved further along the contact pads to their position nearest wall 73. The movement or wiping of contact noses 92 along the contact pads make clean, low resistance pressure electrical connections between the contact noses 92 and the pads 102 and 104.

As illustrated in FIG. 10, foreshortening of contact 64 moves the curved end portions 96 of retention legs 94 together and brings the ends into engagement with cam surfaces 82 and 84 of projection 78. Contact pressure is maintained by elastic bending of contact 64 despite engagement of the end portions of the contact with the projection. The slope of the cam surfaces and the curved contact end portions allow the contact to deform without binding on the projection, which could undesirably increase the closing force or permanently deform the contact.

In both embodiments, the projections are located in the center of the contact passages, obstruct the passages and are spaced inwardly from the opposing top and bottom sides of the plate. As illustrated, each passage has a uniform transverse cross section, with the exception of the projections. When each embodiment contact is fully inserted into a passage the cam follower on the contact which engaged the camming surface during insertion faces away from the camming surface on the projection in the passage. Also, in each embodiment the central portion of the metal contact overlies the free end of the projection and the contact free ends are located between the free end of the projection and the side of the passage supporting the projection. Each contact 14 and 64 is symmetrical to either side of the central portion.

While we have illustrated and described preferred embodiments of our invention, it is understood that this is capable of modification, and we therefore do not wish to be limited to the precise details set forth, but desire to avail ourselves of such changes and alterations as fall within the purview of the following claims.

What we claim as our invention is:

1. An assembly adapted to be interposed between pairs of spaced metallic pads for forming electrical connections between the pads, said assembly comprising:
    a plate formed of a single piece of insulating material and having a top and a bottom, a plurality of spaced passages extending through the thickness of said plate from said top to said bottom thereof, said passages each including opposed interior walls,
    a projection in each passage, each prokection extending outwardly from one of said interior walls toward an opposed interior wall and obstructing said passage mediate said top and bottom of the plate, said projection including an end spaced from said opposed interior wall, a first surface facing said plate top and a second surface facing said plate bottom, each surface extending from said end to said one interior wall, the distance between said surfaces at said one interior wall being greater than the distance between said surfaces at said end of the projection, one of such surfaces including a first camming surface; and
    a metallic contact inserted in each of said passages, each said contact comprising a central portion located
    a projection and an opposed interior wall, a pair of flexible spring members each having an inboard end and an outboard end, the inboard end of each spring member joining said central portion, a contact nose located at the outboard end of each of said spring members, the distance between said contact noses being greater than the thickness of the plate at the passage when the contact is not stressed, and a leg extending inwardly from each of said noses to a leg end, one leg including a cam follower facing away from a first camming surface, said leg ends each located adjacent one of said opposed interior walls;
    each contact confined loosely in a passage for float movement along the passage with the leg ends of the contact located on opposite sides of the projection in the passage and the distance between the leg ends being freater than the height of the projection at the leg ends;
    wherein during insertion of said contacts into said passages said cam followers engage said first camming surfaces and said retention legs are cammed past the projections and snap back beyond the projections.

2. An assembly as in claim 1 wherein each said spring member is arcuate.

3. An assembly as in claim 2 wherein each said spring member is tapered.

4. An assembly as in claim 1 wherein each said leg is rounded at said leg end thereof.

5. An assembly as in claim 1 wherein said surfaces on each projection are sloped.

6. An assembly as in claim 1 wherein said plate is formed from an integral body of insulating material.

7. An assembly as in claim 1 wherein the other of said first and second surfaces includes a second camming surface.

8. The assembly as in claim 7 wherein when the contacts are compressed in the passages, the central portions of the contacts engage the opposed interior walls and each contact leg engages one of said camming surfaces.

9. The assembly as in claim 1 wherein one lef of each contact rests on a girst projection surface facing said top plate and such surface suspends the contact in the passage against gravity.

10. The assembly as in claim 9 wherein both said leg ends are located within the thickness of the plate.

11. The assembly as in claim 1 wherein said top and bottom are parallel to each other and the projection is symmetrical to either side of a plane paralleling said top and bottom and located between the top and bottom.

12. The assembly as in claim 11 wherein each passage is symmetrical to either side of said plane.

13. An interposer assembly comprising:
    A) a plate formed from an integral and seam-free body of insulating material, the plate having a top and a bottom and a thickness between the top and bottom, a passage through the thickness of the plate, a projection extending into the passage from a first side of the passage to a free end, said free end spaced from a second side of the passage by a narrowed portion of the passage, the projection including first and second cam surfaces extending from the free end of the projection toward the first side of the passage, the first cam surface facing the top of the plate and sloping from the free end towards the top of the plate, the second cam surface facing the bottom of the plate and sloping from the free and toward the bottom of the plate, and
    B) a metal contact loosely confined in the passage for limited movement along the passage when unstressed, the contact including a center portion located in the narrowed portion of the passage, a pair of rounded noses spaced apart a distance greater than the thickness of the plate when the contact is unstressed, a pair of spring arms extending from the center portion to the noses, and retention legs extending from the noses to contact ends located on opposite sides of the projection and adjacent the first side of the passage, such contact ends spaced apart a distance greater than the height of the projection when the contact is unstressed, and a cam follower on each retention leg, wherein compression of said contact into the passage by moving opposed contact pads into engagement with said rounded noses moves the noses inwardly of the passage, holds the center portion of the contact against the second side of the passage and moves the contact ends into engagement with and along the cam surfaces toward the end of the projection 14. The interposer assembly as in claim 13 wherein the center portion of the contact is flat and extends along the second side of the passage.

15. The interposer assembly as in claim 13 wherein said arms are arcuate and tapered.

16. The unterposer assembly as in claim 13 wherein said noses are located between the center portion of the metal contact and the contact ends.

17. The interposer assembly as in claim 13 wherein said contact is formed from uniform thickness strip metal stock.

18. The interposer assembly as in claim 13 wherein said contact is symmetrical to either side of the center portion.

19. The interposer assembly as in claim 13 wherein said projection is spaced inwardly from the top and bottom of the plate.

20. The interposer assembly as in claim 13 wherein the metal contact is formed from strip metal stock and the width of the spring arms decreases from the center portion of the noses.

21. An interposer assembly as in claim 13 wherein said plate includes a plurality of additional passages extending through the thickness thereof, each additional passage having a projection extending from a first side thereof to a free end, each such free end spaced from a second side of the passage by a narrowed portion of the passage, a cam surface extending from the free end of each such projection toward the first side of the passage and facing the top of the plate; and a plurality of metal contacts each located in one of such additional passages, each such metal contact including a center portion located in the narrowed portion of a passage.

22. An interposer assembly as in claim 13 wherein said passage includes a reduced width portion, said projection located in said reduced width portion.

23. The interposer assembly as in claim 13 wherein the passage adjacent the first side is narrower than the passage adjacent the second side.

24. The interposer assembly as in claim 23 wherein said passage has a uniform transverse cross section with the exception of the projection.

25. The interposer assembly as in claim 13 wherein each cam surface extends from the free end of the projection to the first side of the passage.

26. The interposer assembly as in claim 25 wherein the passage having an axis extending prependicularly to the top of the plate, and each cam surface extends at an angle of 25 degrees to the axis of the passage.

27. The interposer assembly as in claim 25 wherein said contact ends are rounded and face the cam surfaces.

28. The interposer assembly as in claim 13 wherein said contact is formed from a portion of uniform thickness strip metal stock having two sides, said center portion includes a surface facing said second passage wall, such surface and said noses lying on one of said two sides.

29. The interposer assembly as in claim 28 wherein the contact ends are rounded, face the projection and lie on said one of said two strip sides.

30. The interposer assembly as in claim 28 wherein said spring arms are tapered and said noses lie on one side od said stock.

31. An assembly adapted to be interposed between pairs of spaced metallic pads for forming electrical connections between the pads, said assembly comprising:

a one piece and seam free plate having a substantially flat top and bottom, said plate being formed from an insulating material;

a plurality of spaced passages extending through the thickness pf said plate from said top to said bottom thereof, said passages each including opposed interior walls;

a projection in each passage, each projection extending outwardly from one of said interior walls and toward an opposed interior wall and obstructing said passage mediate said top and bottom of said plate; and each said projection including a first camming surface facing said top of said plate and a second camming surface facing said bottom of said plate; and an unstressed metallic contact loosely disposed in each of said passages free of the plate for limited movement along such passage, each said contact formed from strip metal stock and comprising a pair of flexible spring members, said spring members each having an inboard end and an outboard end.

a central portion joining the inboard ends of said spring members and located between the end of a projection and an adjacent passage wall, a rounded contact nose located at the outboard end of each of said spring members, said contact noses each being adapted to form an electrical connection with a metallic pad, the contact noses being spaced apart a distance greater than the thickness of the plate when the metallic contact is unstressed, and a leg extending inwardly from each of said noses to an innter leg end located adjacent to both a one interior wall and a projection camming surface, the projection in each passage located between the inner leg ends and the contact in the passage, the spacing between the inner leg ends when the contact is unstressed being greater than the height of the projection so that the projection loosely retains the metallic contact in the passage;

wherein upon movement of metallic contact pads against the contact noses and toward the plate the metallic contact is elastically stressed, the inner lef ends engage and move along the camming surfaces, and the center portion engages said adjacent passage wall.

32. The assembly as in claim 31 wherein each metallic contact includes a central portion and is symmetrical to either side of the central portion.

33. The assembly as in claim 31 including a rounded surface located on each inner leg end.

34. The assembly as in claim 31 wherein each passage includes a narrowed portion located between a projection and an opposed interior wall and each metallic contact extends through the narrowed portion of a passage.

35. The assembly as in claim 34 wherein the flexible spring members of each contact are arcuate.

36. The assembly as in claim 35 wherein the flexible spring members are tapered.

37. The assembly as in claim 31 wherein each metallic contact includes a relatively flat spine extending along an opposed passage wall.

38. The assembly as in claim 37 wherein each said camming surface extends from an adjacent said one of said interior walls to the outbound end of a projection.

39. The assembly as in claim 38 wherein the flexible spring members of each contact are arcuate.

40. An interposer assembly for forming electrical connections between pairs of opposed, spaced pads, the assembly including a substantially flat plate formed from an integral bodyof insulating material, a plurality of passages extending through the plate, a projection integral with the body in each passage, a camming surface on each projection, and a plurality of unstressed loose metal contacts, each mtal contact inserted in a passage for limited movement along the passage, each contact including, an integral metal body having a central portion, a pair of spring arms extending in opposite directions away from the central position to outboard spring arm ends, and a contact nose on each outboard spring an arm end of the contact, said contact noses spaced apart a distance greater than the thickness of the plate when the contact is unstressed, and a pair of retention legs, each retention leg extending inwardly from one of said outboard ends of a spring arm to a free end, said free ends spaced apart a distance less than the distance between said noses, said located between said central portion and said free ends and said free ends located to either side of a projection.

41. An interposer assembly as in claim 40 wherein said contacts are formed from uniform thickness metal stock.

42. An interposer assembly as in claim 40 wherein each spring arm is arcuate.

43. An interposer assembly as in claim 40 wherein each spring arm is tapered.

44. An interposer assembly as in claim 40 wherein the free ends of the retention legs are rounded.

45. An interposer assembly as in claim 40 wherein the central portion of each contact includes a flat spine. rojections to secure the contacts in the passages.

46. An interposer assembly as in claim 40 wherein the sides of each projection are sloped.

47. An interposer assembly as in claim 40 wherein each passage includes a narrow portion adjacent the projection in the passage.

48. An interposer assembly for forming electrical connections between spaced pairs of contact pads, the interposer assembly including, A) a uniform thickness plate formed from insulating material and having a top surface, a bottom surface, and a plurality of spaced passages extending through the thickness of the plate between said top surface and said bottom surface, said passages each including opposed interior walls, a projection in the center of the passage, the projection extending outwardly from one of said interior walls toward an opposed interior wall, the projection including an end spaced from said opposed interior wall and a first projection surface facing said plate top surface and a second projection surface facing said plate bottom surface, such projection surfaces each extending from said projection end toward said one interior wall, the distance between said projection surfaces at said one interior wall being greater than the distance between said projection surfaces at said end of the projection;

B) a metallic contact in each of said passages, each said contact comprising a central portion located between the projection and the opposed interior wall in the passage, a pair of arcuate spring members each having an inboard end and an outboard end, the enboard end of each spring member joining said central portion, a contact nose located at the outboard end of each of said spring members, and a leg extending inwardly from eachof said noses to a rounded leg end, said leg ends located on opposite sides of the projection in the passage so that the projections locate the contacts in the passages;

C) the interposer assembly having a first position wherein each contact is unstressed and is confined loosely in a passage for float movement along the passage, the leg ends of the contact are located away from the end of the projection and are spaced apart a distance greater than the height of the projection at the leg ends, and the contact noses of the contact are spaced apart a distance greater than the thickness of the plate; and D) the interposer assembly having a second position in which each contact is elastically stressed within a passage, the rounded leg ends engage the projection surfaces at points located between the end of the projection and the location of the leg ends when the interposer assembly is in the first position, the central portion engages the opposed interior wall, the contact noses engage contact pads positioned on the top and bottom surfaces of the plate, and the contact is elastically stressed to bias the noses against the pads and form pressure electrical connections therewith.

49. An interposer assembly as in claim 48 wherein said contact noses are wiped along said pads to form said electrical connections.

50. The interposer assembly as in claim 48 wherein each contact is symmetrical to either side of the central portion.

51. The interposer assembly as in claim 48 wherein said metal contacts are formed from uniform thickness metal and said spring members have a tapered width decreasing from said central portion to a contact nose.

52. The interposer assembly as in claim 48 wherein the central portion of each contact is flat.

53. The interposer assembly as in claim 48 wherein in each passage the first and second projection surfaces join said one interior wall inwardly from said plate top and bottom surfaces.

54. The interposer assembly as in claim 48 wherein each passage is symmetrical to either side of a plane parallel to said top and bottom surfaces.

55. The interposer assembly as in claim 54 wherein each projection is symmetrical to either side of said plane.

* * * * *

UNITED STATES PATENT AND TRADEMARK OFFICE
CERTIFICATE OF CORRECTION

PATENT NO.    : 6,217,342 B1
DATED         : April 17, 2001
INVENTOR(S)   : Neidich et al.

It is certified that error appears in the above-identified patent and that said Letters Patent is hereby corrected as shown below:

<u>Title page,</u>
Item [56], References Cited, U.S. PATENT DOCUMENTS, insert
-- U.S. Patent No. 5,805,419 issued 9/8/1998 having inventors Hundt et al., class 361/719 --.

<u>Column 7,</u>
Line 33, replace "prokection" with -- projection --;
Line 46, following "located" insert -- between --;
Line 63, replace "freater" with -- greater --.

<u>Column 8,</u>
Line 17, replace "lef" with -- leg --;
Line 18, replace "girst" with -- first --;
Line 43, replace the first occurrence of "and" with -- end --;
Line 62, insert a period -- . -- after "projection".

<u>Column 9,</u>
Line 1, replace "unterposer" with -- interposer --;
Line 13, following "center portion" replace "of" with -- to --;
Line 52, replace "od" with -- of --;
Line 61, replace "pf" with -- of --;
Line 67, delete "and".

<u>Column 10,</u>
Line 10, following "end", replace -- . -- with -- , --;
Lines 53-54, replace "the flexible spring members of each contact are arcuate" with -- each passage has an axis extending perpendicularly to the plate top and each camming surface extends at 25° to the axis of its passage --;
Line 21, replace "innter" with -- inner --;
Line 31, replace "lef" with -- leg --;
Line 61, replace "mtal" with -- metal --.

UNITED STATES PATENT AND TRADEMARK OFFICE
CERTIFICATE OF CORRECTION

PATENT NO. : 6,217,342 B1
DATED : April 17, 2001
INVENTOR(S) : Neidich et al.

It is certified that error appears in the above-identified patent and that said Letters Patent is hereby corrected as shown below:

Column 11,
Line 8, preceding "located" insert -- noses --;
Lines 20-21, following "flat spine." delete "rojections to secure the contacts in the passages.".

Column 12,
Line 2, replace "enboard" with -- inboard --;
Line 6, replace "eachof" with -- each of --.

Signed and Sealed this

Sixth Day of August, 2002

*Attest:*

*Attesting Officer*

JAMES E. ROGAN
*Director of the United States Patent and Trademark Office*